US009116199B2

(12) United States Patent
Deak et al.

(10) Patent No.: US 9,116,199 B2
(45) Date of Patent: Aug. 25, 2015

(54) FULL-BRIDGE MAGNETORESISTIVE ROTATION SENSORS AND MASS FABRICATION METHOD

(75) Inventors: James G. Deak, Zhangjiagang (CN); Weifeng Shen, Zhangjiagang (CN); Xiaojun Zhang, Zhangjiagang (CN); Xiaofeng Lei, Zhangjiagang (CN); Insik Jin, Zhangjiagang (CN); Songsheng Xue, Zhangjiagang (CN)

(73) Assignee: MultiDimension Technology Co., Ltd. (CN)

( * ) Notice: Subject to any disclaimer, the term of this patent is extended or adjusted under 35 U.S.C. 154(b) by 141 days.

(21) Appl. No.: 14/002,734

(22) PCT Filed: Mar. 2, 2012

(86) PCT No.: PCT/CN2012/071889
§ 371 (c)(1),
(2), (4) Date: Sep. 2, 2013

(87) PCT Pub. No.: WO2012/116660
PCT Pub. Date: Sep. 7, 2012

(65) Prior Publication Data
US 2013/0335073 A1 Dec. 19, 2013

(30) Foreign Application Priority Data
Mar. 3, 2011 (CN) .......................... 2011 1 0050704

(51) Int. Cl.
*G01B 7/14* (2006.01)
*G01B 7/30* (2006.01)
*G01R 33/06* (2006.01)
(Continued)

(52) U.S. Cl.
CPC ............... *G01R 33/098* (2013.01); *B82Y 25/00* (2013.01); *G01B 7/30* (2013.01); *G01D 5/145* (2013.01); *G01R 33/093* (2013.01); *H01L 43/08* (2013.01)

(58) Field of Classification Search
CPC ............... G01R 33/093; G01R 33/098; G01R 33/1207; G01R 33/1284; G01R 33/1292; H01L 43/08
USPC ................... 324/51, 55, 200, 207.11, 207.13, 324/207.21, 252
See application file for complete search history.

(56) References Cited

U.S. PATENT DOCUMENTS

| 2010/0090687 A1* | 4/2010 | Wang et al. ............... 324/207.13 |
| 2011/0244599 A1* | 10/2011 | Whig et al. ........................ 438/3 |
| 2013/0300409 A1* | 11/2013 | Deak et al. ..................... 324/252 |

*Primary Examiner* — Jermele M Hollington
*Assistant Examiner* — Raul Rios Russo
(74) *Attorney, Agent, or Firm* — Schwegman Lundberg & Woessner, P.A.

(57) ABSTRACT

A single package magnetoresistive angle sensor for use in measuring rotation angle of a magnet is disclosed. The magnetoresistive angle sensor comprises a pair of magnetoresistive sensor chips, wherein one of the chips is rotated by 180-degree rotation relative to the other. The magnetoresistive sensor chips are attached to a standard semiconductor package lead frame to form a single-axis push-pull full-bridge sensor. Each of the magnetoresistive sensor chips comprises a pair of magnetoresistance sensor arms. Each magnetoresistive sensor arm comprises one or more GMR or MTJ sensor elements. The GMR of MTR sensor elements utilize a pined layer. The element blocks of the magnetoresistive sensor electrically are interconnected and connected to the package leads by wirebonding. The magnetoresistive angle sensor can be packaged into various standard semiconductor package designs. Also, provided is a dual-axis push-pull full-bridge magnetoresistive angle sensor comprised of two pairs of magnetoresistive sensor chips.

14 Claims, 13 Drawing Sheets

(51) Int. Cl.
*H01L 43/08* (2006.01)
*G01R 33/09* (2006.01)
*B82Y 25/00* (2011.01)
*G01D 5/14* (2006.01)
*G01R 33/02* (2006.01)

US 9,116,199 B2

FULL-BRIDGE MAGNETORESISTIVE ROTATION SENSORS AND MASS FABRICATION METHOD

CROSS-REFERENCE TO A RELATED APPLICATION

This application is a 35 U.S.C. §371 national phase application of PCT/CN2012/071889, filed on Mar. 2, 2012, which claims priority to a Chinese Patent Application No. CN201110050704.6, filed on Mar. 3, 2011, incorporated herein by reference in its entirety.

FIELD OF THE INVENTION

The invention relates generally to single-package magnetoresistive angle sensors, with specific emphasis on magnetic field sensors used in combination with a permanent magnet in order to provide a non-contact measurement of rotation angle.

BACKGROUND OF THE INVENTION

Magnetic sensors in combination with a rotating magnet provide an attractive means for non-contact measurement of the orientation of rotating shafts in various automotive, industrial, and consumer applications. There are many different types of sensors in the prior art for measuring the orientation of a magnetic field. However, they all suffer from various limitations well known in the art, for example, excessive size, inadequate sensitivity and/or dynamic range, cost, reliability and other factors. Thus, there continues to be a need for improved magnetic sensors, especially sensors that can be easily integrated with semiconductor devices and integrated circuits and manufacturing methods thereof.

Magnetic tunnel junction (MTJ) sensors have the advantages of high sensitivity, small size, low cost, and low power consumption. Although MTJ devices are compatible with standard semiconductor fabrication processes, methods for building high sensitivity devices with sufficient yield for low cost mass production have not been adequately developed. In particular, yield issues due to difficulty in MTJ process and backend packaging process, and difficulty in matching the magnetoresistive response of MTJ elements when combined to form bridge sensors have proven difficult.

SUMMARY OF THE INVENTION

In order to solve the problems mentioned above, the present invention provides a design and a method for mass production of magnetic rotation sensors (or angle sensors) using standard multi-chip semiconductor packaging processes in order to produce high-performance MTJ or giant magnetoresistive (GMR) angle sensors. The disclosed design and manufacturing method use a standard semiconductor package that contains at least one pair of MTJ or GMR sensor chips in order to produce push-pull full-bridge magnetic angle sensors. Full-bridge push-pull rotation sensors are advantageous in that they produce the largest possible output signal; they compensate changes in ambient temperature, and when constructed properly, provide some resistance to process dependent variation in the sensor transfer curves. The disclosed angle sensor thus provides a low cost method for producing high accuracy, high output angle sensor devices.

In a first implementation, a single-package magnetoresistive rotation sensor is composed of sensor chips, wherein the chips are a pair of MTJ or GMR magnetoresistive sensor chips, wherein one of the sensor chips in the pair is rotated 180 degrees with respect to the other, and the sensor chips are adhered to a standard semiconductor package lead frame and configured as a single-axis magnetoresistive rotation sensor. Each sensor chip configured as a pair of magnetoresistive elements, where each of the magnetoresistive elements in the pair is composed of a string of one or more GMR or MTJ magnetoresistive sensor elements. The sensor elements are spin-valves comprised of a free magnetic layer and a pinned magnetic layer, where the direction of the pinned magnetic layer may be set in any orientation relative to the magnetic easy-axis of the sensor element, provided the intrinsic saturation field of the free magnetic layer is at least a factor of 10 less than the pinning field of the pinned magnetic layer. The free magnetic layer includes no magnetic biasing in the direction perpendicular to the direction of the pinned layer magnetization, such that the free layer magnetization rotates proportionally to the direction of an applied magnetic field. The intrinsic saturation field of each magnetoresistive sensor element minus the offset magnetic field of the sensor chip's transfer curve is less than magnetic field the sensor bridge is intended to measure. The oppositely oriented magnetoresistive sensor chips have similar $R_H$ and $R_L$ values to each other. Each magnetoresistive sensor chip has a crossover in the top and bottom conductors, such that the bond pads on one side of the sensor chip are swapped in position with respect to the magnetoresistive elements, in order to permit wirebonding of the two identical chips in order to form a push-pull full-bridge sensor without crossing the bond wires. The bond pads of each sensor chip are designed such that more than one wire bond may be attached to each side of each string of magnetoresistive elements. The input and output connections of the bridge composed of the magnetoresistive sensor chips are wire bonded to the lead frame.

In a second implementation, the invention may be implemented as a dual-axis single-package magnetoresistive rotation sensor. The sensor utilizes two pairs of MTJ or GMR magnetoresistive sensor chips, wherein one of the sensor chips in each pair is rotated 180 degrees with respect to the other chip in the pair, and the sensor chips are adhered to a standard semiconductor package lead frame wherein the sensor chips a push-pull bridge sensor; Each pair of sensor chips comprising a full bridge sensor is rotated 90 degrees with respect to the other pair of sensor chips, such that the sensor can detect two orthogonal magnetic field components; The sensor elements are configured as a spin-valve comprised of a free magnetic layer and a pinned magnetic layer, where the direction of the pinned magnetic layer may be set in any orientation relative to the magnetic easy-axis of the sensor element, provided the intrinsic saturation field of the free magnetic layer is at least a factor of 10 less than the pinning field of the pinned magnetic layer; The free magnetic layer includes no magnetic biasing in the direction perpendicular to the direction of the pinned layer magnetization, such that the free layer magnetization rotates proportionally to the direction of an applied magnetic field; The intrinsic saturation field of each magnetoresistive sensor element minus the offset magnetic field of the sensor chip's transfer curve is less than magnetic field the sensor bridge is intended to measure; Each magnetoresistive sensor chip has a crossover in the top and bottom conductors, such that the bond pads on one side of the sensor chip are swapped in position with respect to the magnetoresistive elements, in order to permit wirebonding of the two identical chips in order to form a push-pull full-bridge sensor without crossing the bond wires. The oppositely oriented magnetoresistive sensor chips have similar $R_H$ and $R_L$ values to each other. The bond pads of each sensor chip are designed such that more than one wire bond may be attached

DESCRIPTION OF THE DRAWINGS

FIG. 9 (B). A plot of the angle calculated from the output of a dual axis rotation sensor, and the error in the rotation angle due to the gradient in the applied magnetic field.

FIG. 10 (B). A plot of the angle calculated from the output of a dual axis rotation sensor, and the error in the rotation angle due to the large gradient in the applied magnetic field.

FIG. 11 (B). A plot of the angle calculated from the output of a dual-axis rotation sensor wherein the orthogonal axes of the sensors have a common center, and the reduction in error in the rotation angle in the common center configuration.

DETAILED DESCRIPTION

The sensor elements of the disclosed angle sensor are configured as spin valves, that is, they contain one magnetic layer this has a magnetization that is nominally fixed in orientation, often referred to as the reference layer, and another ferromagnetic layer that has a magnetization that is free to move in response to an applied magnetic field, normally called the free layer. The reference layer can be a single magnetic layer or a synthetic ferromagnetic structure, which is pinned by the pinning layer. In a MTJ element, the free layer and reference layer are separated by an insulating barrier, and electrical current tunnels through the barrier. In a GMR element, the free layer and the pinned layer are separated by a non-magnetic metallic layer. Electrical current can flow either in the plane of the GMR thin film or perpendicular to the plane.

Figure 1:
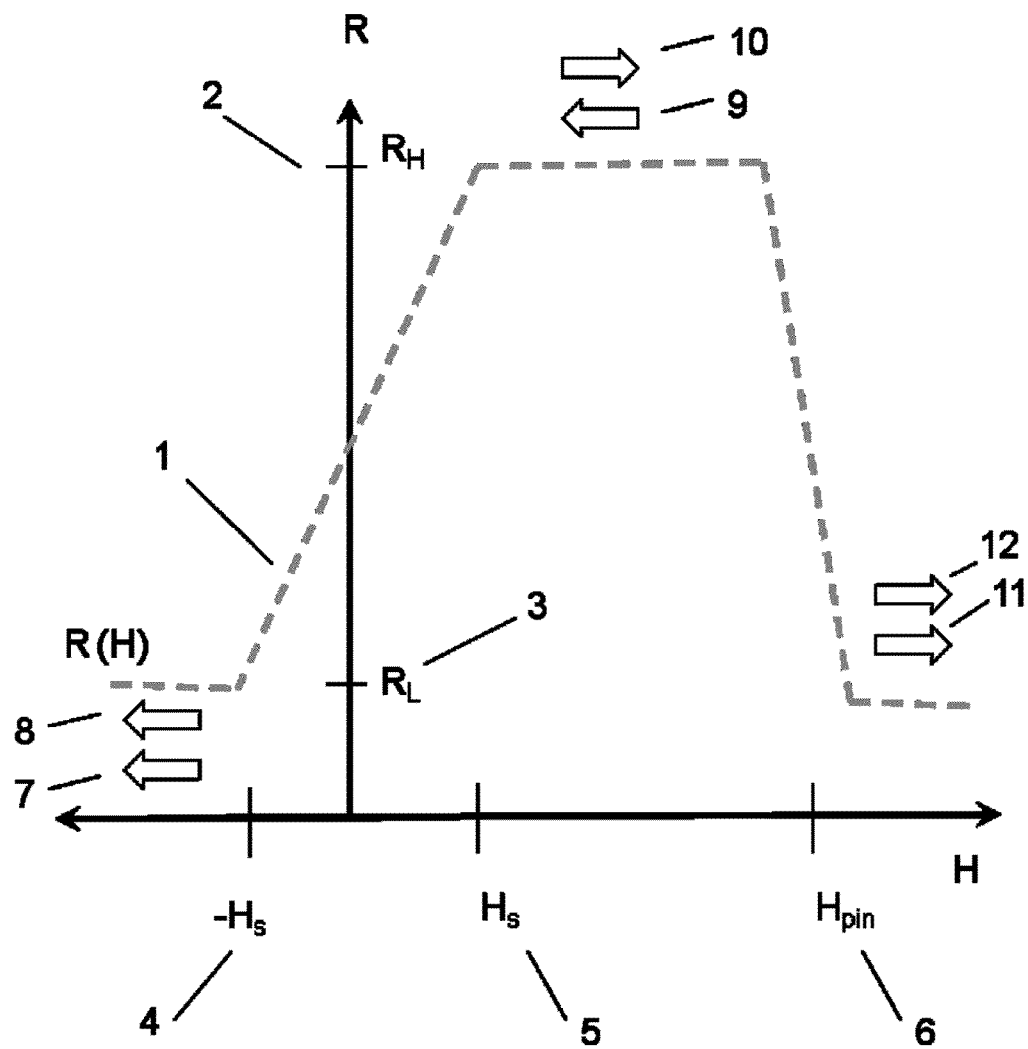
FIG. 1. Schematic drawing of the magnetoresistive response of a spin-valve sensing element with the reference layer magnetization pointing in the negative H direction.

The general form of the magnetoresistive transfer curve of a GMR or MTJ magnetic sensor element suitable magnetic field measurement is shown schematically in FIG. 1. The transfer curve 1 depicted in the figure saturates at low $R_L$ 3 and high $R_H$ 2 resistance values, $R_L$ and $R_H$, respectively at a saturation field, $-H_s$ 4, and $H_s$ 5. In the $R_L$ 3 state, the magnetization of the free layer 8 and reference layer 7 are oriented in the same direction. In the $R_H$ region, the magnetizations of the reference 9 and free layers 10 are oriented in opposite directions. In the region between $H_s$ 5 and $-H_s$ 4, the transfer curve is ideally centered about zero applied magnetic field. Here the magnetization of the free layer moves with respect to the magnetization of the reference layer.

In non-ideal cases, the transfer curve is not symmetric about the H=0 point in the plot. The saturation fields 4 and 5 are typically offset by an amount that is determined by the interlayer coupling between the free layer and the pinned layer. A major contributor to the interlayer coupling, so called Neel coupling or "orange-peel" coupling, is related to roughness of the ferromagnetic films within the GMR and MTJ structures, and it is dependent on materials and manufacturing processes. Additionally, at some large value of the applied magnetic field, $H_{pin}$ 6, the magnetization of the reference layer is no longer fixed and thus the device saturates back into the $R_L$ state as both the reference and free layer magnetizations saturate in the direction of the large applied magnetic field. Neel Coupling and low values of $H_{pin}$ can cause significant inaccuracy in the angle sensor if not properly controlled.

Figure 2:
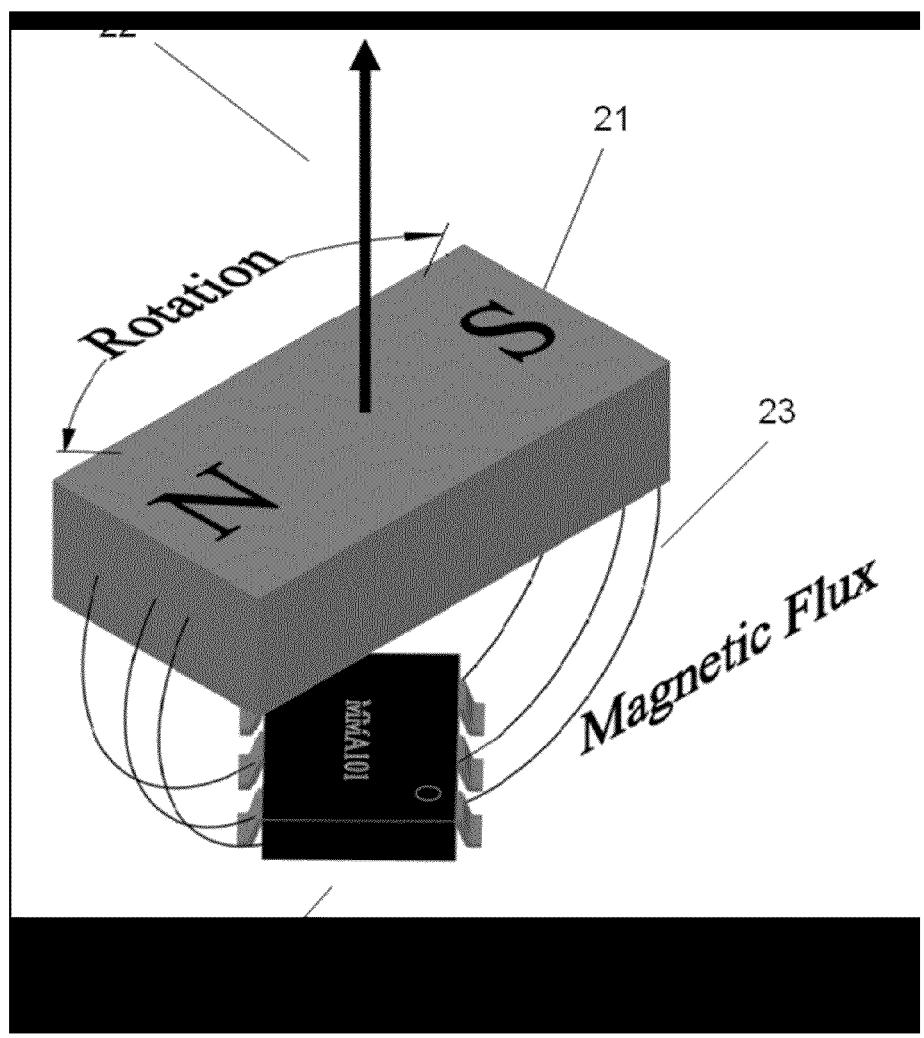
FIG. 2. A schematic drawing of a rotation sensor illustrating the working principle.

As the name suggests, magnetic angle sensors are used to detect the angle of an applied magnetic field, rather than the magnitude of the field. The concept is illustrated in FIG. 2. Here the angle sensor 20 is used to detected the angle of a rotating shaft 22, by detecting the orientation of a magnetic field 23 produced by a magnet 21 attached to the rotating shaft 22. In rotation detection systems of this sort, accuracy of the rotation sensor is affected by the strength, uniformity, and centering of the magnet with respect to the center of the angle sensor. Increasing magnet size and alignment accuracy improves the accuracy of the rotation detection system, but at the expense of increased cost and size. An optimal angel detection sensor design may need to accommodate nonuniformity in the applied magnetic field. There are various arrangements of the sensor elements which can be used to optimize the angle sensor design for cost, performance, and size, which are the topic of this invention.

Figure 3:
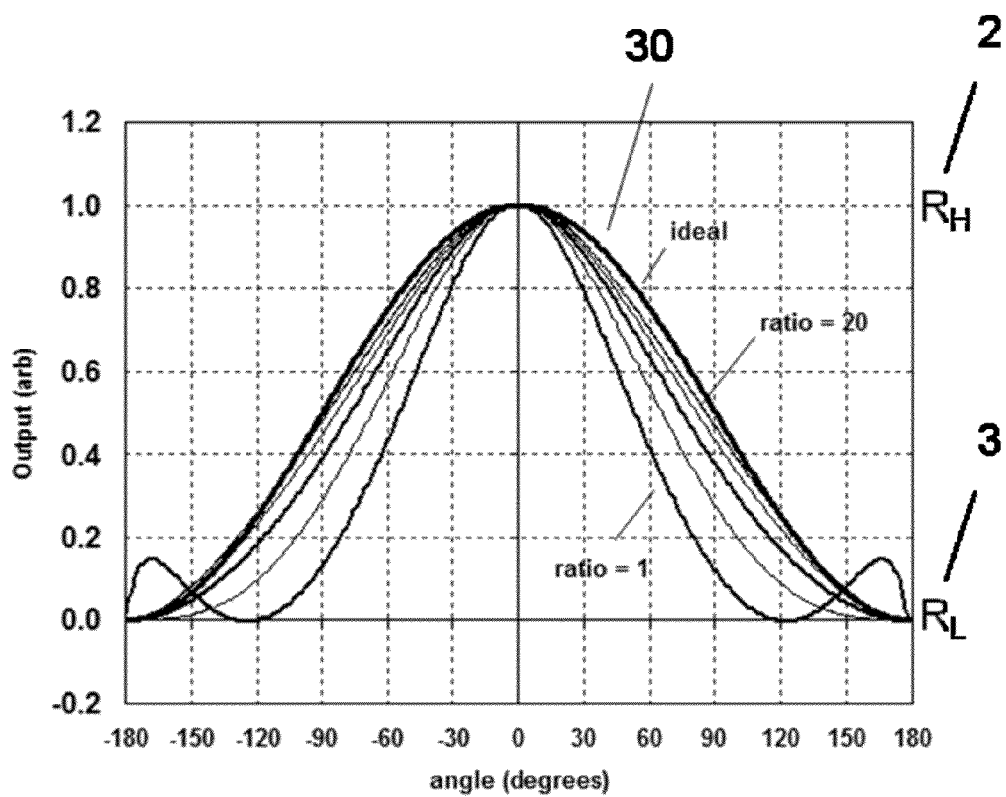
FIG. 3. A plot of the response of a sensor element configured as a rotation sensor, in which the ration of the pinning field of the reference layer is increased relative to the field produced by the rotating magnet.

In addition to field uniformity, the strength of the applied magnetic field also affects angle sensor accuracy. Generally, the angle sensor will be operated using a magnetic field greater than $H_s$ (5), but less than $H_{pin}$ (6), and the exact shape of the R(H) transfer curve at $-H_s<H<H_s$ is not important. FIG. 3 shows the effect of magnetic field strength on the shape of the angle dependent transfer curve of a magnetic rotation sensor element. The different curves are plotted as a function if the ratio of $H_{pin}$ to the applied magnetic field, $H_{app}$. Note that as the ratio of $H_{pin}/H_{app}$ increases, the output curve of the sensor element as a function of the angle of the applied magnetic field approaches the ideal cosine curve 30 in FIG. 3. The reason for this is the reference layer magnetization rotates slightly in response to $H_{app}$, and increasing the value of $H_{pin}$ decreases the amount of undesired rotation of the reference layer magnetization from the desired. For best performance, it is desired to keep $H_{pin}/H_{app}>10$.

The full bridge magnetic field sensors can be used to manufacture a magnetic rotation sensor. Full bridge sensors provide greater output voltage then half-bridge sensors, and therefore have greater magnetic field sensitivity. Additionally, any offset error in the transfer curves of the sensor elements is canceled when using a push-pull full bridge, with the pinned layer of the different chips oriented in opposite directions. In this two-chip full-bridge case, the resistance of each leg can be expressed as $$R_+(H) = \frac{R_H - R_L}{2H_s}(H_\| - H_o) + \frac{R_H + R_L}{2} \quad (1)$$

$$R_-(H) = \frac{R_L - R_H}{2H_s}(H_\| + H_o) + \frac{R_H + R_L}{2} \quad (2)$$

Figure 4:
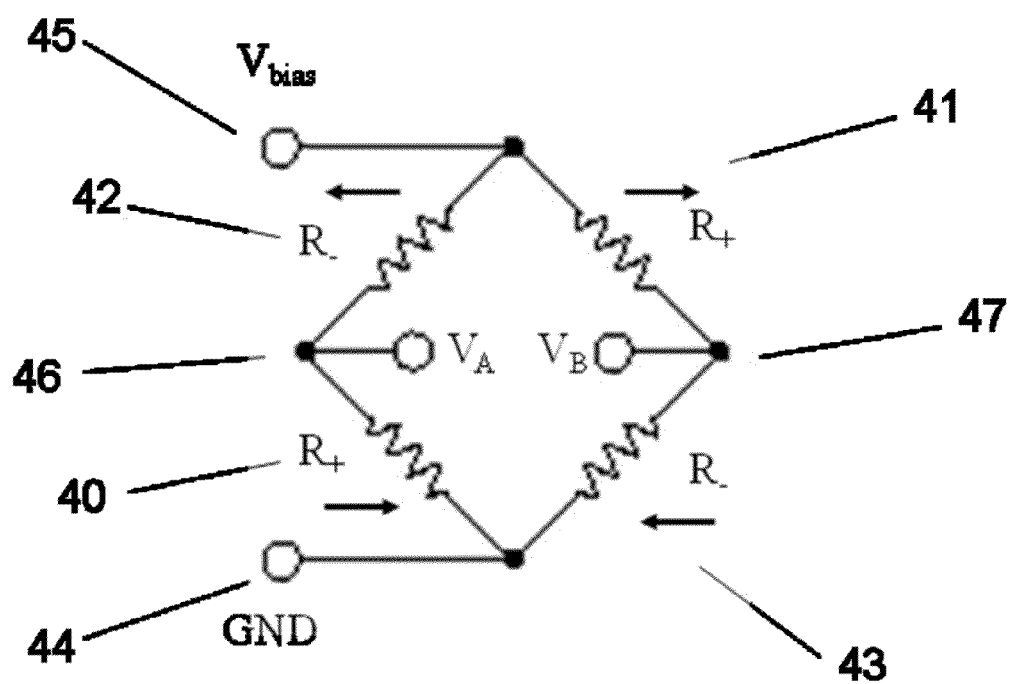
FIG. 4. A schematic drawing of a push-pull full bridge rotation sensor used to detect one component of the field produced by the rotating magnet.
Figure 5:
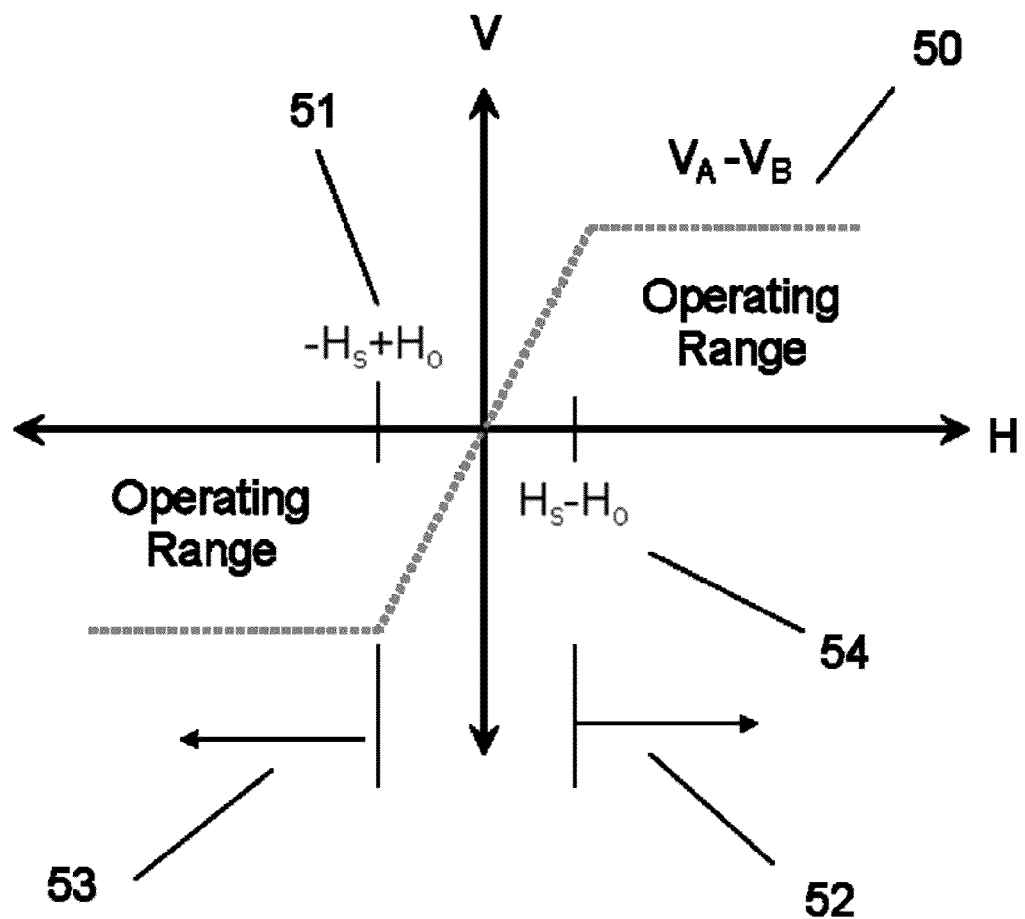
FIG. 5. A plot of the response of a push-pull bridge composed of rotation sensor elements as a function of the magnitude of a field applied collinearly with the sensing axis.

Here $H_o$ is the offset field of the transfer curve, and $H_\|$ is the component of the magnetic field along the sensing axis. A full bridge arrangement utilizing four magnetoresistive sensor elements is shown schematically in FIG. 4. Here, two spin-valves 42, 43 have their reference layer magnetizations pinned to the left, and two spin-valves 40, 41 have their reference layer magnetizations oriented to the right. The bridge may be current or voltage biased, but typically it is voltage biased, at a voltage $V_{bias}$ 45 with respect to ground 44 (GND). The output is the difference between nodes $V_A$ 46 and $V_B$ 47, and it is shown schematically in FIG. 5 as 50. The output can be expressed in terms of magnetoresistance. Assuming the magnetoresistance is expressed as $MR=(R_H-R_L)/R_L$, then $$V_A - V_B = \frac{(R_H - R_L)V_{bias}}{H_s(R_H + R_L) - H_o(R_H - R_L)}H_\| \quad (3)$$

$$V_A - V_B = \frac{V_{bias}}{(H_s - H_o) + (2/MR)H_s}H_\| \quad (4)$$

Note that $H_o$ no longer acts to produce an asymmetry in the transfer, and the full-bridge response $V_A-V_B$ is bipolar in voltage response. The sensitivity increases as MR is increased, but for $MR>>(H_s+H_o)/(2H_s)$ the response does not increase much. The point of diminishing returns is about MR>500%. The lower extent of the operating region 52, 53 of the angle sensor bridge is $\pm(H_s-H_o)$.

Figure 6:
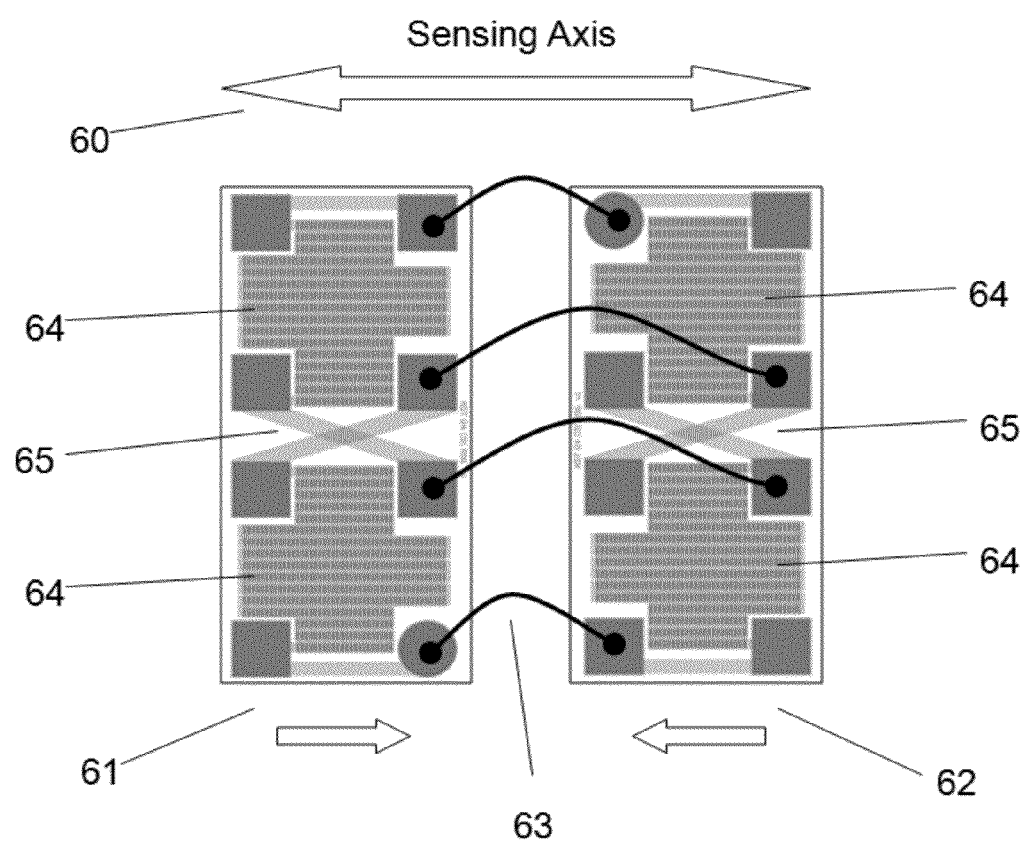
FIG. 6. A schematic drawing showing two magnetoresistive chips rotated by 180 degrees with respect to each other and interconnected in order to form a push-pull full bridge.

FIG. 6 shows a full bridge composed of two sensor chips 61 and 62 that are rotated by 180 degrees with respect to each other. Each of the sensor chips is composed of a pair of magnetoresistive elements 64, each of which is composed of a string of one or more MTJ or GMR sensor elements. Each of the sensor chips further includes a cross-over structure 65 that swaps the position of two of the bond pads with respect to the magnetoresistive elements 64. This permits the chips to be interconnected without crossing the bond wires 63. The full bridge is intended to detect fields along an axis 60 that is collinear with the reference direction of each sensor chip.

Figure 7:
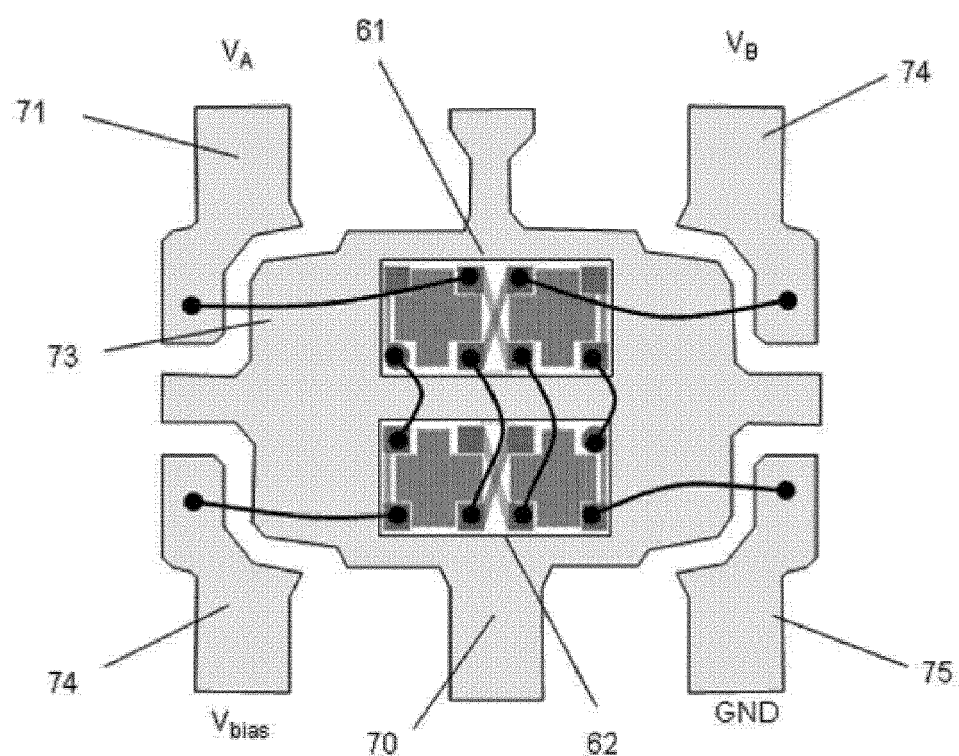
FIG. 7. A schematic drawing of a single axis rotation sensor using a standard semiconductor lead frame and wire bonding.

FIG. 7 shows a possible arrangement of the two sensor chips 61 and 62 on the paddle 70 of a standard semiconductor package lead frame to produce a single axis angle sensor. The two chips are connected to terminals $V_A$ (71), $V_B$ (72), $V_{bias}$ (74), and ground 75 using wirebonds 73. The lead frame may be encapsulated in plastic in order to form a standard semiconductor package. If necessary, the sensor chips may be preselected before packaging in order to best match their performance. This may be accomplished by testing the sensors at wafer level and sorting the chips into different bins based on their transfer curve characteristics, so that the chips packaged together as shown in FIG. 6 would be well matched in order to produce a sensor with low offset.

Figure 8:
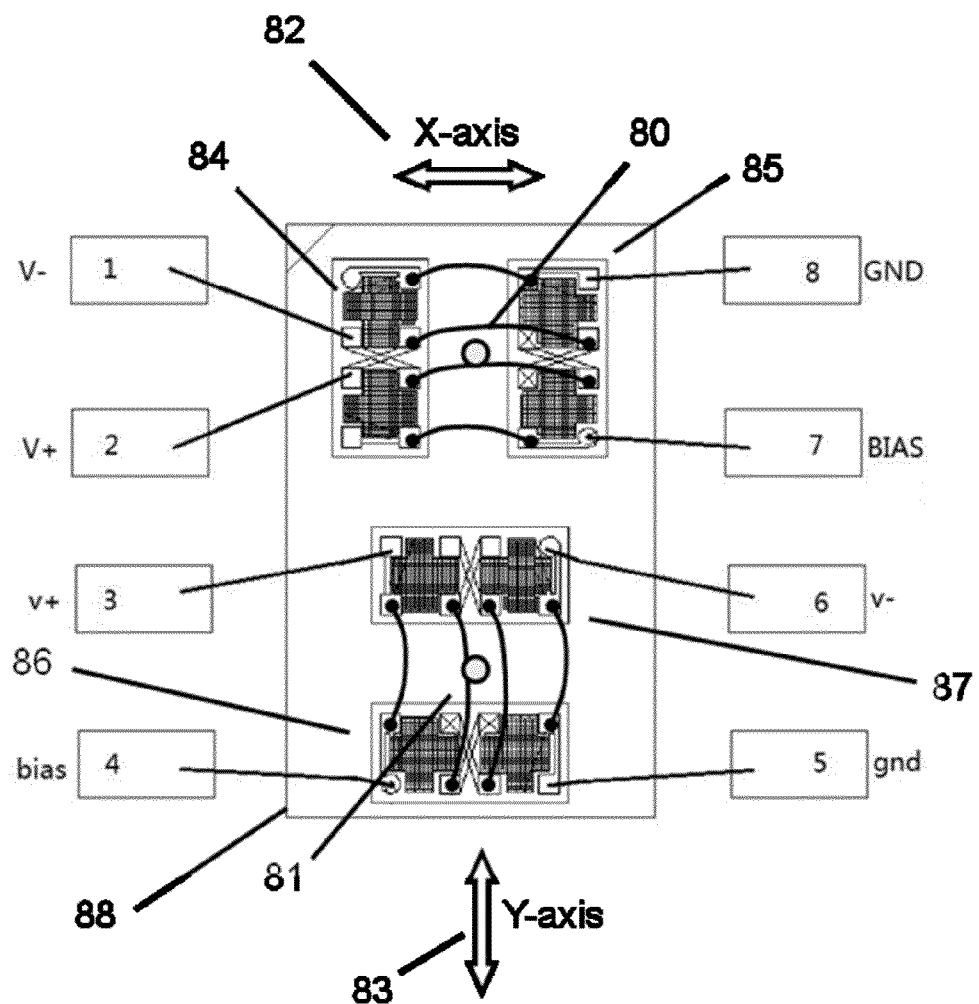
FIG. 8. A schematic drawing of a dual-axis rotation sensor using a standard semiconductor lead frame and wire bonding, in which the two axes do not share a common center.

FIG. 8 shows a possible implementation of a low cost dual-axis rotation sensor that can detect the X (82) and Y (83) components of the rotating magnetic field. Here, the X and Y components are detected by two separate push-pull full bridge magnetic sensors composed of chip pairs 84/85 and 86/87 that are rotated such that their sensing axes 82 and 83 are orthogonal to each other. The chips are placed on a standard chip carrier or lead frame 88 and wirebonded to the output pins.

Unlike a single-axis rotation sensor, as in FIG. 7, which cannot distinguish between θ, and θ+π, the dual-axis arrangement in FIG. 8 is useful for unambiguously computing the rotation angle of the shaft attached to the magnet. The X and Y components of the field detected by a dual axis sensor can be related to the rotation angle as follows:

$$\cos\theta = \frac{V_x - \text{offset}}{V_x^{peak}} \quad (5)$$

$$\sin\theta = \frac{V_y - \text{offset}}{V_y^{peak}} \quad (6)$$

$$\theta = \begin{cases} a\tan\left(\left(\frac{Vy - \text{offset}}{Vx - \text{offset}}\right)\right); & \sin\theta > 0, \cos\theta > 0 \\ a\tan\left(\left(\frac{Vy - \text{offset}}{Vx - \text{offset}}\right)\right) + \pi/2; & \sin\theta > 0, \cos\theta < 0 \\ a\tan\left(\left(\frac{Vy - \text{offset}}{Vx - \text{offset}}\right)\right) + \pi; & \sin\theta < 0, \cos\theta < 0 \\ a\tan\left(\left(\frac{Vy - \text{offset}}{Vx - \text{offset}}\right)\right) + 3\pi/2; & \sin\theta < 0, \cos\theta > 0 \end{cases} \quad (7)$$

Where $V_x$ is the output of the x-axis bridge, $V_y$ the output of the y-axis bridge, offset is an offset voltage in the bridge response, and the $V^{peak}$ voltages represent the peak voltage of each sinusoidal waveform.

An issue with the dual-axis design of FIG. 8 is the X and Y sensors do not share a common center. The separation between the center of each bridge sensor, 80 and 81 can be large enough that gradients in the field from the rotating magnet can produce significant errors.

Figure 9:
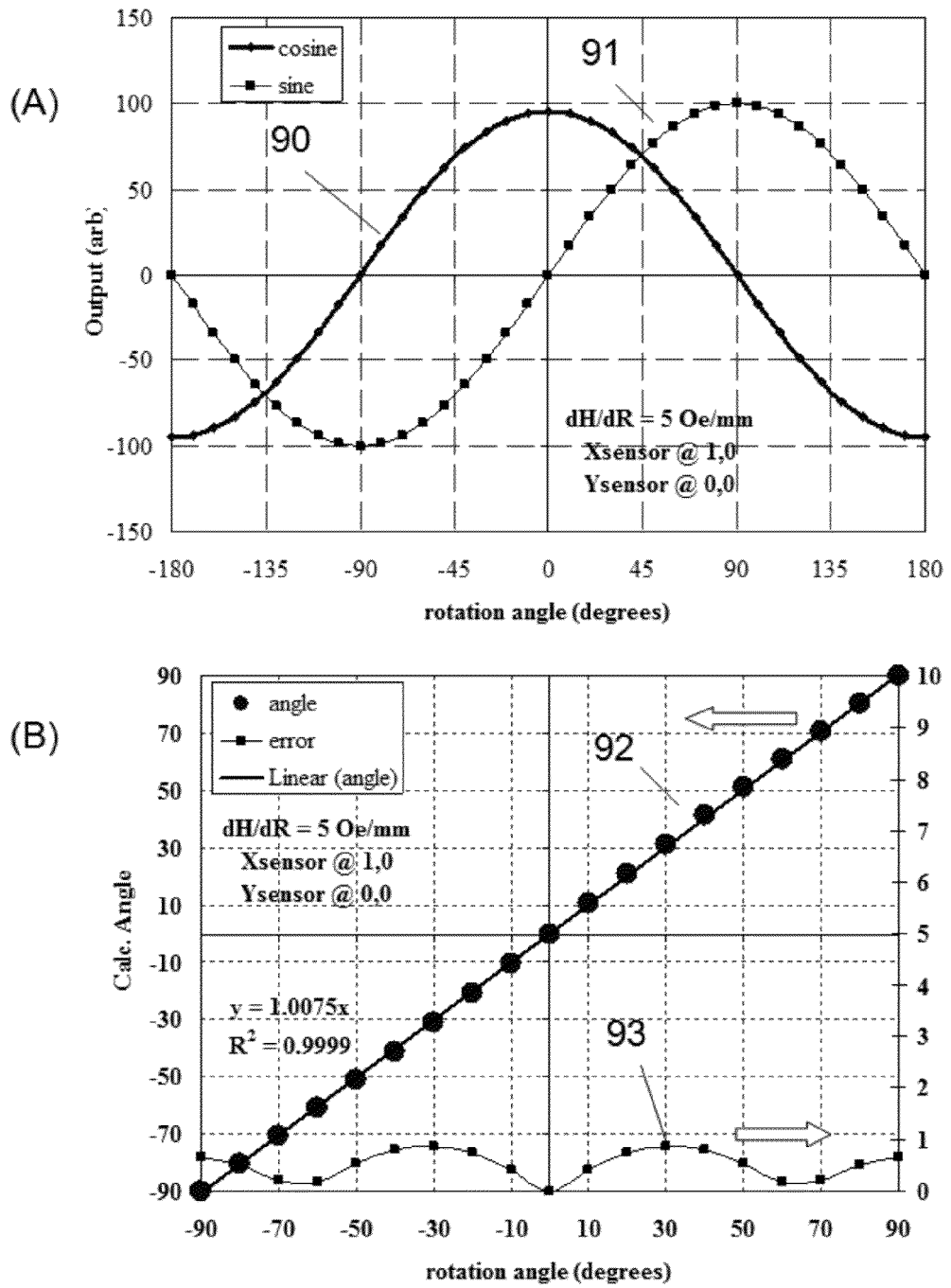
FIG. 9 (A). A plot of the output of a dual axis rotation sensor, as depicted in FIG. 7, where the two different axes have a center that is separated by 1 mm, and there is a small gradient in the magnetic field produced by the rotating magnet. The two orthogonal axes represent the sine and cosine of the rotation angle of the applied magnetic field.
Figure 10:
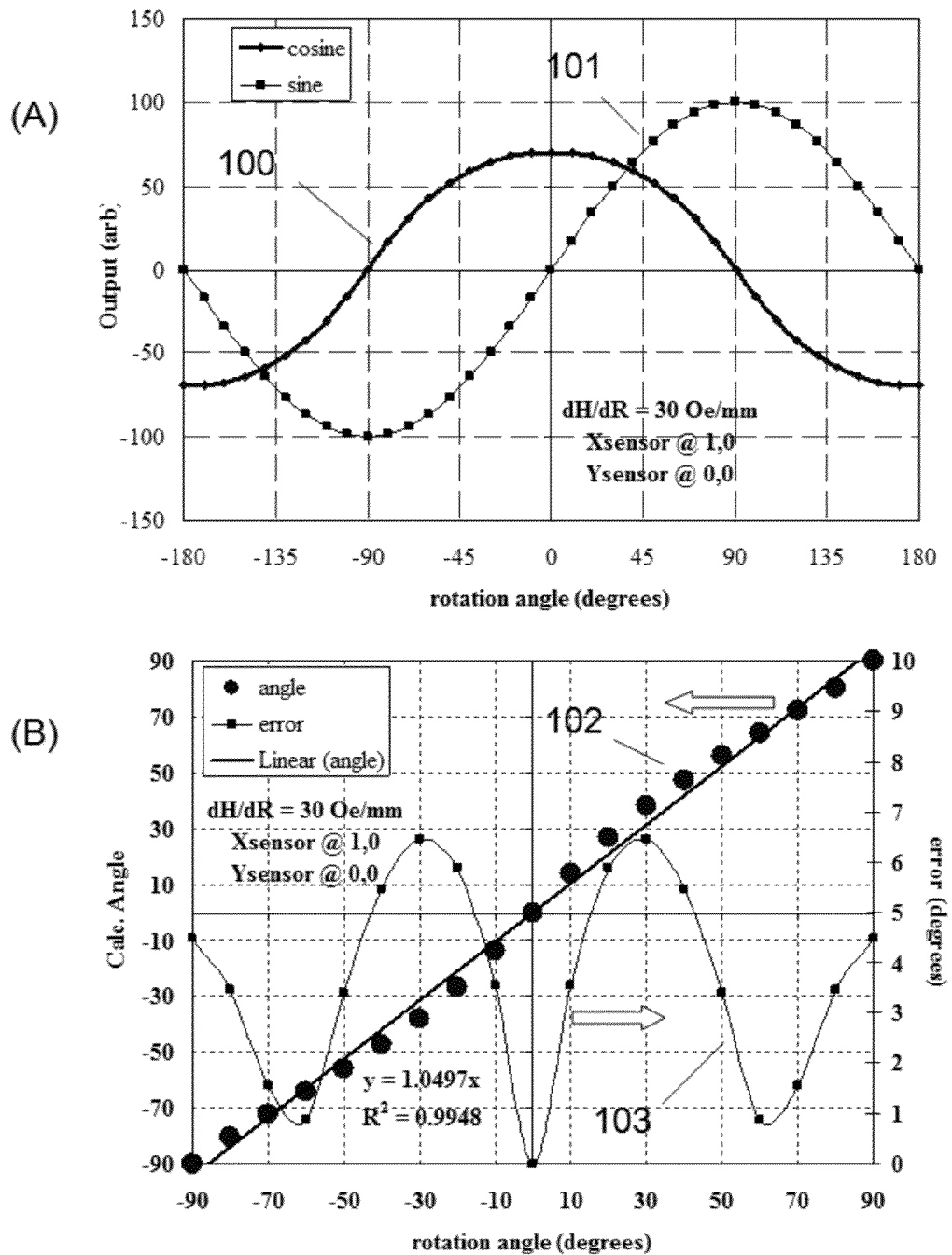
FIG. 10 (A). A plot of the output of a dual axis rotation sensor, as depicted in FIG. 7, where the two different axes have a center that is separated by 1 mm, and there is a large gradient in the magnetic field produced by the rotating magnet.

FIG. 9 (A) shows the sine 91 and cosine 90 waveforms detected by two orthogonal bridges that are displaced from each other by 1 mm, where the field from the rotating magnet has a gradient of 5 Oe/mm. FIG. 9 (B) shows the computed angle in the first quadrant 92, and the deviation of the computed angle from the actual angle at 93. Note that in this case where the gradient is relatively small such that it doesn't produce a significant change in field between the two bridge centers 80 and 81, the error introduced in the sensors is not very large. As the gradient increases, the difference in peak field between the two sensors and distortion in the sine 101 and cosine 100 waveforms can become significant so as to introduce large errors 103 in the computed angle 102 as shown in FIG. 10 for a gradient of 30 Oe/mm.

Figure 11:
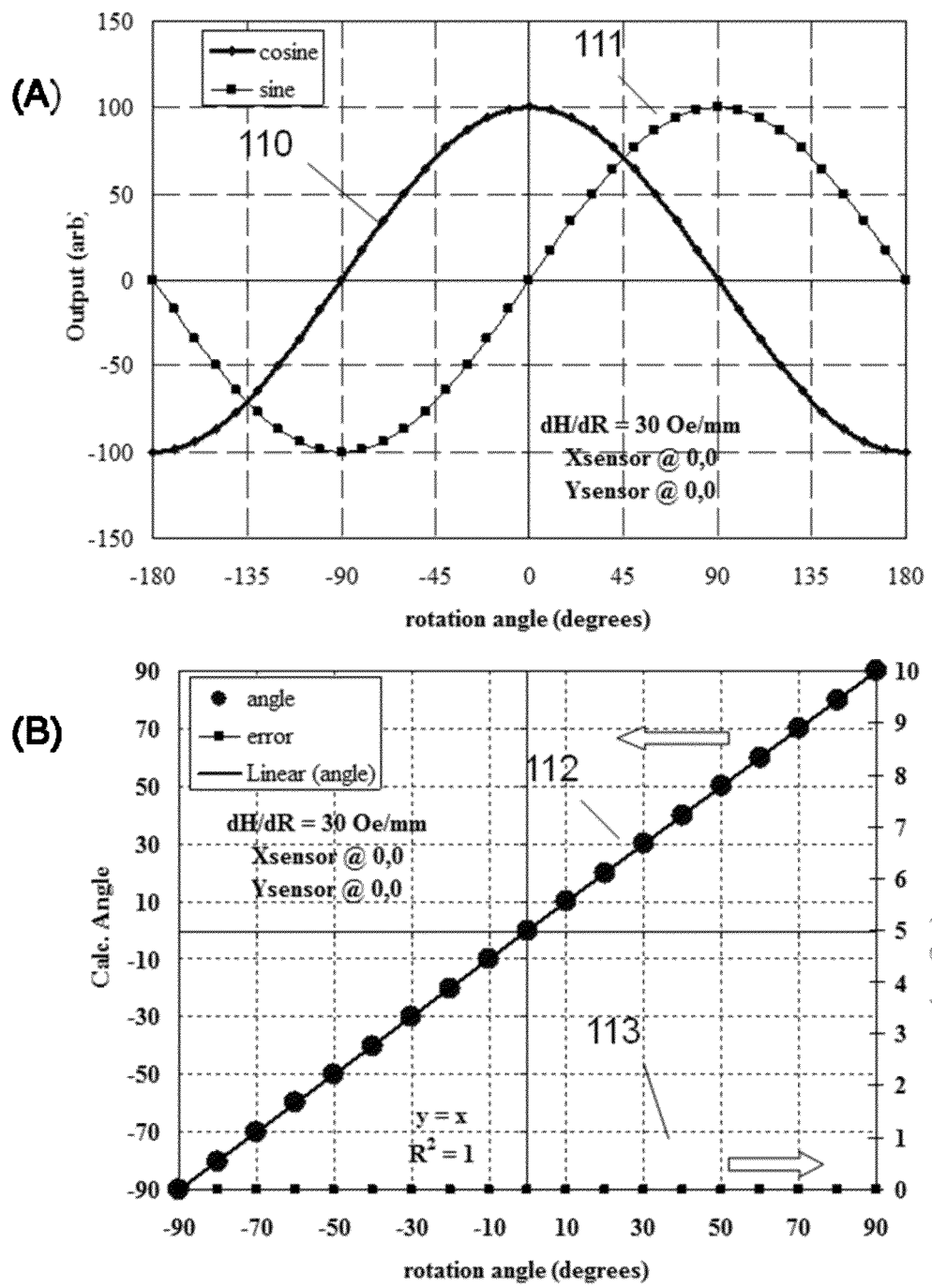
FIG. 11 (A). A plot of the output of a dual axis rotation sensor, where the two different axes have a common center, and there is a large gradient in the magnetic field produced by the rotating magnet.

The dual axis rotation sensor becomes more tolerant of large gradients when the centers of the X and Y sensor bridges are coincident. Here the sine 111 and cosine 110 waveforms are not distorted by the 30 Oe/mm gradient. The result is shown in FIG. 11.

There are many possible arrangements of the sensor chips in the angle sensor package that can be used to create a coincident center of the orthogonal bridge sensors, but generally speaking, the closer the sensors are to each other, the more resistant the sensor will to errors produced by gradients in the field from the rotating magnet.

Figure 12:
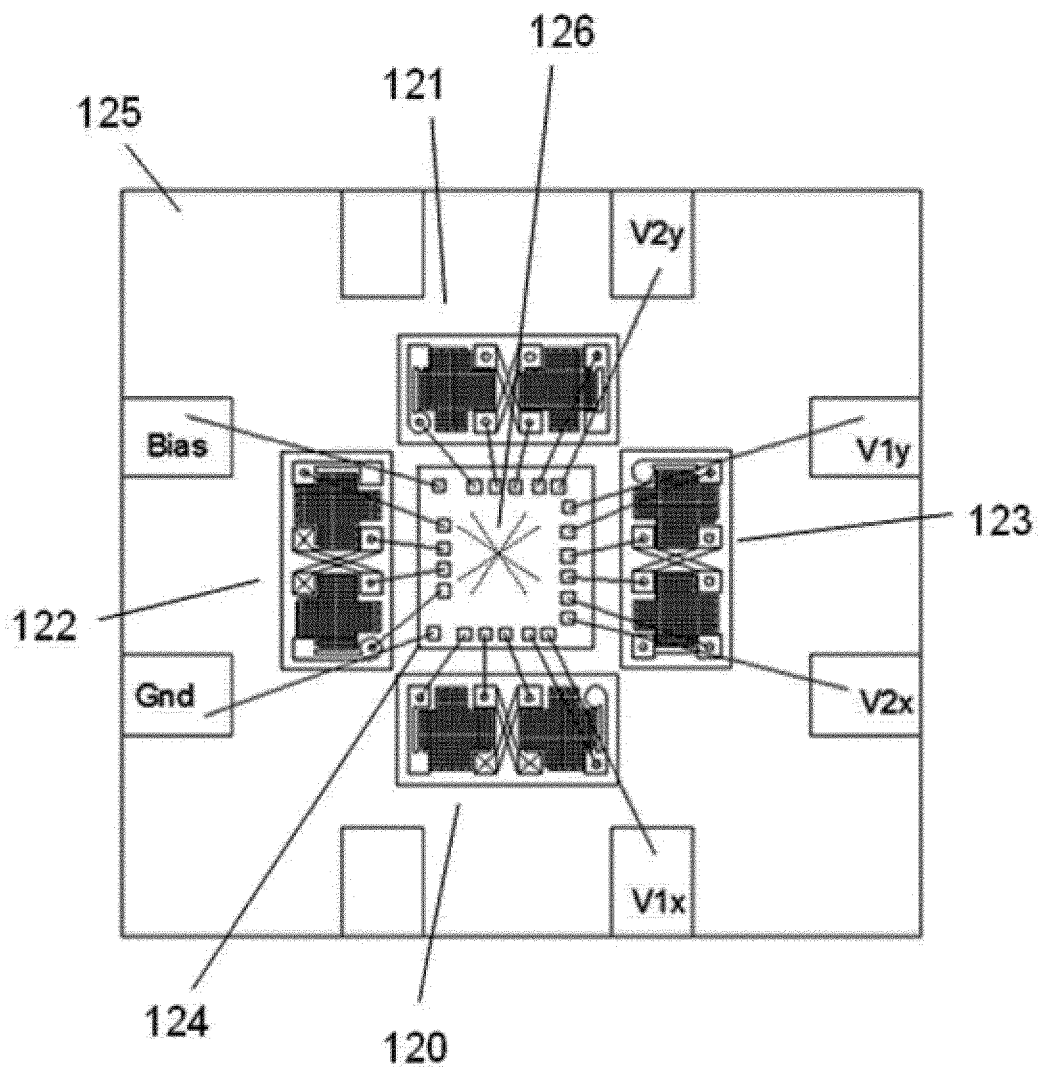
FIG. 12. An illustration of one possible arrangement for a common-center dual-axis rotation sensor, in which the sensor chips surround a central application specific integrated circuit.

FIG. 12 shows one possible arrangement of four sensor chips 120, 121, 122, and 123 to produce a dual axis angle sensor that detects the sine and cosine components of the rotating magnetic field. The four sensors are placed around the circumference of a central ASIC 124, and interconnected to it by standard wire bonding techniques. The four chips are arranged such that the orthogonal full bridges have a common center at 126. The central ASIC may contain electrostatic discharge protection circuitry, and it may also be used to provide circuitry for processing the signals from the orthogonal sensors in order to provide the output angle in digital format.

Figure 13:
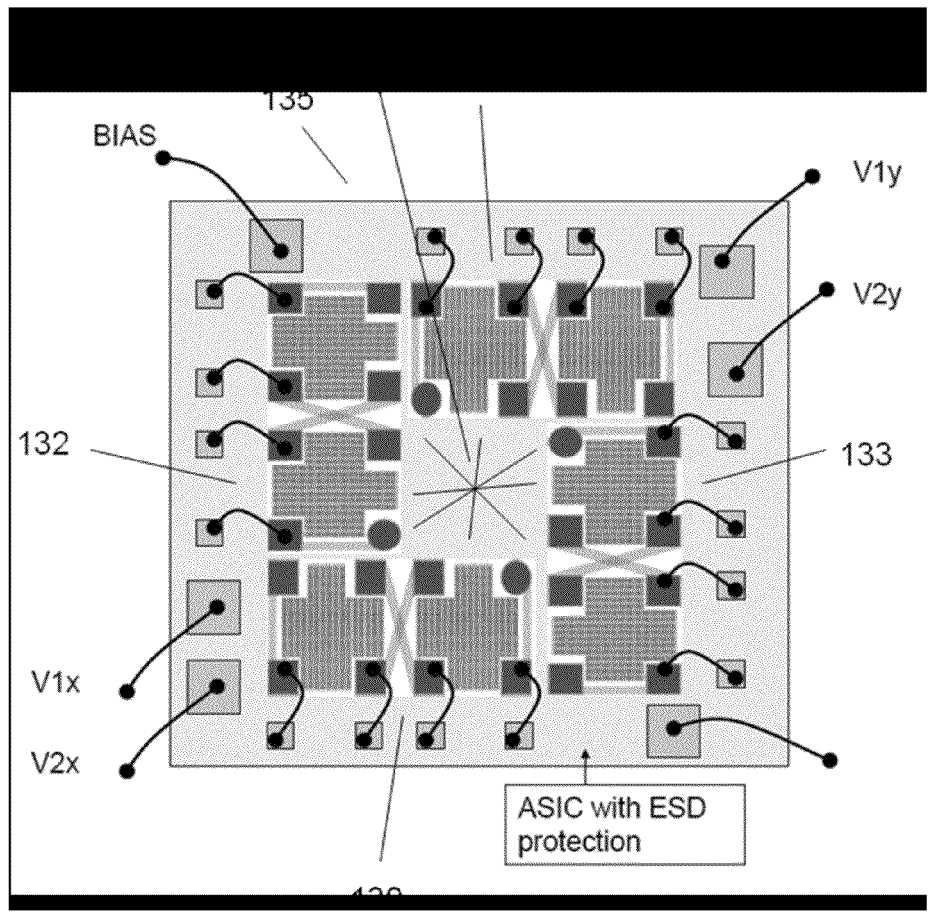
FIG. 13. An illustration of one possible arrangement for a common-center dual-axis rotation sensor, in which the sensor chips are stacked on top of an application specific integrated circuit.

FIG. 13 shows one possible arrangement of four sensor chips 130, 131, 132, and 133 to produce a dual axis angle sensor that detects the sine and cosine components of the rotating magnetic field. The four sensors are placed with circular symmetry with respect to each other and on top of an ASIC 135. Unlike the design in FIG. 12, the sensor chips are skewed so that the sensors are closer to the common geometric center. The four chips are arranged such that the orthogonal full bridges have a common center at 136. The ASIC 135 may contain electrostatic discharge protection circuitry, and it may in addition contain circuitry for processing the signals from the orthogonal sensors and providing the output angle in digital format.

It will be apparent to those skilled in the art that various modifications can be made to the disclosed invention without departing from the scope or spirit of the invention. Further, it is intended that the present invention cover modifications and variations of the present invention provided that such modifications and variations come within the scope of the appended claims and their equivalence.

What is claimed is:

1. A single-package magnetoresistive rotation sensor, comprising:
   a pair of MTJ or GMR magnetoresistive sensor chips, wherein one of the MTJ or GMR magnetoresistive sensor chips in the pair is rotated 180 degrees with respect to the other, and the MTJ or GMR magnetoresistive sensor chips are adhered to a semiconductor package lead frame and configured as a single-axis push-pull full-bridge rotation sensor;
   each of the MTJ or GMR magnetoresistive sensor chips is configured as a pair of magnetoresistive elements, where each of the magnetoresistive elements in the pair comprises a string of one or more GMR or MTJ magnetoresistive sensor elements;
   the GMR or MTJ magnetoresistive sensor elements are configured as a spin-valve comprised of a free magnetic layer and a pinned magnetic layer, where the direction of the pinned magnetic layer is free to rotate relative to the magnetic easy-axis of the GMR or MTJ magnetoresistive sensor element, and the intrinsic saturation field of the free magnetic layer is at least a factor of 10 less than the pinning field of the pinned magnetic layer;
   the free magnetic layer includes no magnetic biasing in the direction perpendicular to the direction of the pinned magnetic layer magnetization, such that the free magnetic layer magnetization rotates proportionally to the direction of an applied magnetic field;
   the intrinsic saturation field of each GMR or MTJ magnetoresistive sensor element minus the offset magnetic field of the GMR or MTJ magnetoresistive sensor chip's transfer curve is less than magnetic field the sensor bridge is intended to measure;
   bond pads of each GMR or MTJ magnetoresistive sensor chip are designed such that more than one wire bond is attached to each side of each string of GMR or MTJ magnetoresistive sensor elements;
   each GMR or MTJ magnetoresistive sensor chip has a crossover in top and bottom conductors, such that the bond pads on one side of the GMR or MTJ magnetoresistive sensor chip can be swapped in position with respect to the magnetoresistive elements, in order to permit wirebonding of the two identical GMR or MTJ magnetoresistive sensor chips to form the single-axis push-pull full-bridge rotation sensor without crossing the corresponding bond wires;
   the oppositely oriented GMR or MTJ magnetoresistive sensor chips have similar $R_H$ and $R_L$ values to each other; and
   the input and output connections of the MTJ or GMR magnetoresistive sensor chips are wire bonded to the semiconductor package lead frame.

2. A single-package magnetoresistive rotation sensor comprising
   two pairs of MTJ or GMR magnetoresistive sensor chips, wherein one of the MTJ or GMR magnetoresistive sensor chips in each pair is rotated 180 degrees with respect to the other chip in the pair, and the MTJ or GMR magnetoresistive sensor chips are adhered to a semiconductor package lead frame to form a single-axis push-pull full-bridge rotation sensor;
   each pair of MTJ or GMR magnetoresistive sensor chips comprising the single-axis push-pull full-bridge rotation sensor is rotated 90 degrees with respect to the other pair, such that the single-axis push-pull full-bridge rotation sensor can detect two orthogonal magnetic field components;
   each of the pair of MTJ or GMR magnetoresistive sensor chips is configured as a pair of magnetoresistive elements, where each of the magnetoresistive elements in the pair comprises a string of one or more GMR or MTJ magnetoresistive sensor elements;
   the MTJ or GMR magnetoresistive sensor elements are configured as a spin-valve comprised of a free magnetic layer and a pinned magnetic layer, wherein the direction of the pinned magnetic layer is free to rotate relative to the magnetic easy-axis of the sensor element, and the intrinsic saturation field of the free magnetic layer is at least a factor of 10 less than the pinning field of the pinned magnetic layer;
   the free magnetic layer includes no magnetic biasing in the direction perpendicular to the direction of the pinned layer magnetization, such that the free layer magnetization rotates proportionally to the direction of an applied magnetic field;
   an intrinsic saturation field of each MTJ or GMR magnetoresistive sensor element minus the offset magnetic field of the MTJ or GMR magnetoresistive is less than magnetic field the sensor bridge is intended to measure;
   bond pads of each MTJ or GMR magnetoresistive sensor chip are designed such that more than one wire bond may be attached to each side of each string of magnetoresistive elements;

each MTJ or GMR magnetoresistive sensor chip has a crossover in the top and bottom conductors, such that the bond pads on one side of the MTJ or GMR magnetoresistive sensor chip are swapped in position with respect to the magnetoresistive elements, in order to permit wire bonding of the two identical MTJ or GMR magnetoresistive sensor chips forming the single-axis push-pull full-bridge rotation sensor without crossing the corresponding bond wires;

the oppositely oriented MTJ or GMR magnetoresistive sensor chips have similar $R_H$ and $R_L$ values to each other; and the input and output connections of the MTJ or GMR magnetoresistive sensor chips are wire bonded to the semiconductor package lead frame.

3. A single-package magnetoresistive rotation sensor as in claim 1, wherein the GMR or MTJ magnetoresistive sensor chips are tested and sorted before assembly in order to better match their transfer curve characteristics.

4. A single-package magnetoresistive rotation sensor as in claim 1, where the semiconductor package lead frame and GMR or MTJ magnetoresistive sensor chips are encapsulated in plastic to form a standard semiconductor package.

5. A single-package magnetoresistive rotation sensor as in claim 1, comprising a biasing magnetic field accomplished by a permanent magnet.

6. A single-package magnetoresistive rotation sensor as in claim 2, in which the MTJ or GMR magnetoresistive sensor chips are placed around the circumference of a central application specific integrated circuit chip, such that the two full bridge sensors for each axis share a common geometric center, wherein, in this configuration, only the corners of each MTJ or GMR magnetoresistive sensor chip touch, and adjacent MTJ or GMR magnetoresistive sensor chips are orthogonal to each other.

7. A single-package magnetoresistive rotation sensor as in claim 6, wherein the central application specific integrated circuit includes electrostatic discharge protection circuitry.

8. A single-package magnetoresistive rotation sensor as in claim 6, wherein the central application specific integrated circuit contains electrostatic discharge protection circuitry and circuitry for calculating the angle of a magnetic field and providing the output of the calculated angle in a digital format.

9. A single-package magnetoresistive rotation sensor as in claim 2, in which the MTJ or GMR magnetoresistive sensor chips are placed on top of an application specific integrated circuit chip, wherein, in this configuration, the each axis maintains a 90 degree rotation with respect to the other, but the MTJ or GMR magnetoresistive sensor chips are configured so the that a short edge of each MTJ or GMR magnetoresistive sensor chip touches the long edge of an adjacent MTJ or GMR magnetoresistive sensor chip.

10. A single-package magnetoresistive rotation sensor as in claim 9, wherein the application specific integrated circuit contains electrostatic discharge protection circuitry.

11. A single-package magnetoresistive rotation sensor as in claim 9, wherein the application specific integrated circuit contains electrostatic discharge protection circuitry and circuitry for calculating the angle of the magnetic field and providing the output of the calculation in a digital format.

12. A single-package magnetoresistive rotation sensor as in claim 2, wherein the semiconductor package lead frame and the MTJ or GMR magnetoresistive sensor chips are encapsulated in plastic to form a standard semiconductor package.

13. A single-package magnetoresistive rotation sensor as in claim 2, wherein the MTJ or GMR magnetoresistive sensor chips are tested and sorted before assembly in order to match their transfer curve characteristics.

14. A single-package magnetoresistive rotation sensor as in claim 2, comprising a biasing magnetic field accomplished by a permanent magnet.

* * * * *